United States Patent
Aziz et al.

(10) Patent No.: US 7,037,143 B2
(45) Date of Patent: May 2, 2006

(54) FRONT ACCESS LAN AND TIMING (SATT)

(75) Inventors: Farid Aziz, Kanata (CA); Peter Ajersch, Gloucester (CA); Lloyd Cosman, Stittsville (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 10/864,851

(22) Filed: Jun. 9, 2004

(65) Prior Publication Data

US 2005/0277327 A1 Dec. 15, 2005

(51) Int. Cl.
*H01R 9/22* (2006.01)

(52) U.S. Cl. ............... 439/719; 439/528; 439/709; 385/134

(58) Field of Classification Search ........ 439/528–529, 439/61, 709, 719, 540.1, 544; 361/724–729, 361/683; 211/26; 385/134–135; 174/66–67
See application file for complete search history.

(56) References Cited

U.S. PATENT DOCUMENTS

| | | | | |
|---|---|---|---|---|
| 5,175,673 A | * | 12/1992 | Roger et al. | 361/818 |
| 5,497,444 A | * | 3/1996 | Wheeler | 385/135 |
| 5,708,742 A | | 1/1998 | Beun et al. | 385/53 |
| 6,532,332 B1 | * | 3/2003 | Solheid et al. | 385/134 |
| 2003/0108320 A1 | | 6/2003 | Letourneau | 385/135 |
| 2003/0174996 A1 | * | 9/2003 | Henschel et al. | 385/135 |
| 2005/0117309 A1 | * | 6/2005 | Rieken et al. | 361/724 |

* cited by examiner

*Primary Examiner*—Michael C. Zarroli
(74) *Attorney, Agent, or Firm*—Ridout & Maybel LLP

(57) ABSTRACT

A recessed connectorized faceplate assembly for connecting multiple cables at the front of an electronics equipment shelf. The recessed connectorized faceplate assembly includes a connectorized faceplate defining the back wall of a cabling volume behind where a standard faceplate would normally be situated. The cabling volume has an aperture admitting cables routed from a cable trough situated between equipment shelves. The front of the cabling volume comprises a hinged faceplate granting access to the cabling volume. Access is via a pivoting panel forming one of the sidewalls. A bridging cable connecting the circuit card containing the faceplate to the backplane allows partial withdrawal of the card while maintaining connections.

21 Claims, 3 Drawing Sheets

FRONT ACCESS LAN AND TIMING (SATT)

FIELD OF THE INVENTION

The present invention relates to a recessed connectorized faceplate assembly and is particularly concerned with accommodating a plurality of cable terminations with protection of cable connections.

BACKGROUND OF THE INVENTION

In existing electronic systems it is well known to use printed circuit board assemblies intended to be mounted in shelves. The printed circuit boards assemblies or cards are disposed next to each other in the shelf and are oriented vertically to facilitate cooling. These printed circuit board assemblies typically include a printed circuit board on which are mounted electronic and optical components. At the rearmost edge the printed circuit board electrical and optical connectors are disposed for connection to a backplane or midplane provided in the shelf. The printed circuit board assemblies also typically use a faceplate mounted to the printed circuit board on the foremost edge. These faceplates serve a variety of purposes including providing mechanical stiffening, providing a protective front enclosure face for the printed circuit board assembly, providing a means for EMC/RFI shielding, providing a background for labelling purposes, and acting as a mounting point for display elements and switches. The faceplates may act also as a mounting point for connectors.

In electronic systems using a shelf/rack assembly where multiple equipment shelves are mounted in a stack arrangement in a rack, much intra-shelf signalling is accomplished over the backplane or midplane of the shelf. Signalling between cards within the shelf may be readily accomplished via signalling paths traversing the backplane.

This approach runs into difficulties when fiber optic signalling paths are required between circuit boards, and when inter-shelf signalling i.e. signalling paths between cards on different shelves are required. With optical connectors at the back of the shelf, cleaning and servicing of the optical fibers is difficult because of limited accessibility. Signalling paths between cards on different shelves encounters the difficulty of traversing the shelf-to-shelf separation as there is no backplane or midplane.

A known method of resolving this difficulty is to provide connectors on the faceplates of those cards requiring optical connections. Access for cleaning and servicing purposes is facilitated. Likewise, for those connections to be routed between shelves, connectors disposed on the faceplate allow cabling to be routed from the circuit card faceplate on one shelf to a circuit card faceplate on a different shelf.

Provision of faceplate connectors carries with it the problems of exposure to mechanical damage, and a problem of aesthetics. Cables terminating upon a faceplate connector are typically routed in a cable trough provided as part of the rack or shelf assembly. While traversing the cable trough the cables are relatively protected, however at some point the cables must exit the cable trough and range through space in front of the faceplate until terminating at the connector on the faceplate. The resulting placement tends to leave a portion of the cable exposed to accidental and incidental mechanical damage. Further, a plurality of cables terminating upon circuit card faceplates may begin to resemble a tangled skein, detracting from the aesthetics of the equipment installation and resulting in an unfinished or unprofessional impression of the equipment.

In view of the foregoing, it would be desirable to provide a faceplate for a circuit board which overcomes the above-described inadequacies and shortcomings by providing a mechanism which provides connector access but minimizes accidental and incidental contact to the cables and connectors.

SUMMARY OF THE INVENTION

An object of the present invention is to provide an improved connectorized faceplate assembly.

According to an aspect of the present invention there is provided a faceplate assembly for a circuit pack in an equipment shelf having a cable routing trough vertically adjacent the equipment shelf. The faceplate assembly has an elongated housing having a vertical first and second side surface spaced apart and disposed in parallel to each other defining a pair of side edges and a vertical rear surface disposed substantially 90° to said side surfaces whereby the rear surface and first and second side surfaces define a cabling volume. There is an aperture defined at a vertical end of the cabling volume in open communication between the cabling volume and the cable routing trough, and a plurality of connectors disposed on the rear surface for the termination of cables routed through the cable trough and the aperture.

Advantages of the present invention include a protecting and/or segregating of the cables and the connectors as the range from connector to connector being substantially enclosed by the side walls of the cabling volume.

Conveniently the faceplate assembly may be provided with a plurality of retention tabs on said side edges disposed adjacent to the aperture end of the cabling volume for retaining cables therewithin. These retention tabs assist in maintaining cables within the cabling volume.

Conveniently the faceplate assembly may be provided with a detachable access cover securable to the elongated housing for providing a vertical front face to the cabling volume. This access cover provides the advantages of further assisting in retaining cables within the cabling volume, precluding accidental ingress to the cabling volume, and covering the plurality of cables terminating on the plurality of connectors thereby resulting in a more pleasing appearance.

Also conveniently, the access cover may be provided with a hinge and also with a locking means. The provision of a hinge allows for all the advantages of an access cover while eliminating the necessity of storing the access cover when working with the cables and connectors. The provision of a locking means enhances security of the access cover, both against accidental opening and providing a measure of protection against unauthorized intrusion.

Advantageously, the second side surface may have a panel and a vertical hinge means whereby the panel may be displaced away from the first side surface upon withdrawing the circuit pack from the equipment shelf. As a further advantage, the circuit board upon which the faceplate assembly is disposed may have a bridging cable connected at a first end to the circuit pack and a backplane connector connected at a second end of the bridging cable for connection to a backplane or a midplane of the equipment shelf. The bridging cable allows the circuit board and faceplate assembly to be partially withdrawn from the equipment shelf, allowing the panel to be opened widely. This effectively opens up the cabling volume for facilitating access to the plurality of connectors disposed on said rear surface. Further, the widened access facilitates access to and rearrangement of the cables within the cabling volume in the event that a particular specific cable needs to be separated and removed or replaced.

Conveniently the plurality of connectors disposed on the rear surface defining the cabling volume may consist of electrical connectors, optical connectors, or a mix of connector types appropriate to the operational context.

In accordance with another aspect of the present invention there is provided a method for providing physical protection of a plurality of cable connection points on a faceplate for a circuit pack in an equipment shelf having a cable routing trough vertically adjacent the equipment shelf, the method comprising the steps of providing a faceplate assembly comprising an elongated housing having a vertical first and second side surface spaced apart and disposed in parallel to each other defining a pair of side edges; a vertIcal rear surface disposed approximately 90° to the side surfaces whereby the rear surface and first and second side surfaces define a cabling volume; an aperture in open communication between the cabling volume and the cable routing trough; and a plurality of connectors disposed on the rear surface. Next, routing a cable from a distal connection point via the cable routing trough and through the aperture into the cabling volume; and terminating the cable on one of the plurality of connectors.

Advantages of this aspect of the present invention include having a method for protecting and/or segregating the cables and the connectors as the cables range outside of the cable routing trough.

Conveniently, the faceplate assembly may be provided with a number of other features including cable retention tabs for facilitating retention of the cables within the cabling volume, a detachable access cover securable to the elongated housing for providing a vertical front face to the cabling volume, a hinge and also a locking means for the access cover, and a panel and vertical hinge means on the second side surface. A mix of optical and electrical connector types may be disposed on the rear surface.

Advantages of these features of the method include better retention of cables within the cabling volume, a means for precluding accidental ingress to the cabling volume, and a more pleasing appearance when the access cover conceals a plurality of cables. Further advantages of several of the features include enhanced access to the cabling volume and enhanced security of the cabling volume and cable terminations.

The present invention will now be described in more detail with reference to exemplary embodiments thereof as shown in the appended drawings. While the present invention is described below with reference to the preferred embodiments, it should be understood that the present invention is not limited thereto. Those of ordinary skill in the art having access to the teachings herein will recognize additional implementations, modifications, and embodiments which are within the scope of the present invention as disclosed and claimed herein.

BRIEF DESCRIPTION OF THE DRAWINGS

The invention will be further understood from the following detailed description of embodiments of the invention and accompanying drawings in which.

DETAILED DESCRIPTION

Figure 1:
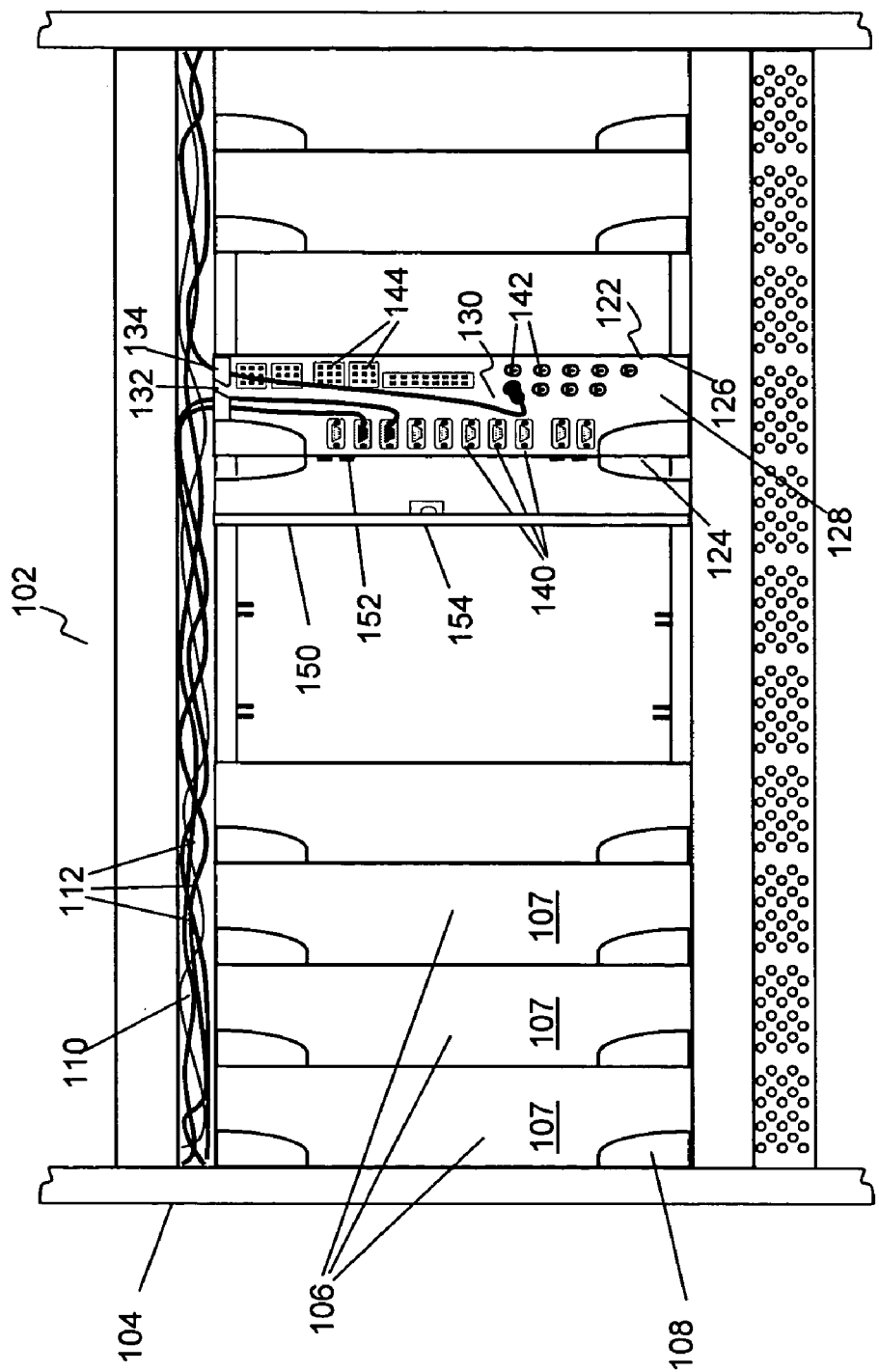
FIG. 1 is a front view of an equipment shelf equipped with a recessed connectorized faceplate according to an embodiment of the invention.

Referring to FIG. 1 there may be seen a shelf 102 for electronic equipment mounted in typical style on the frame 104 of a rack. Within the shelf are mounted circuit cards 106 adjacent to one another across the shelf and oriented vertically. Alternative arrangements may also provide for horizontal mounting (not shown). The circuit cards 106 have connectors at the rearmost edge which are mated to corresponding connectors located on the backplane or midplane of the shelf. The circuit cards have faceplates 107 at the foremost edge. These faceplates 107 serve a variety of purposes including providing mechanical stiffening, providing a protective front enclosure face for the printed circuit board assembly, providing a means for EMC/RFI shielding, providing a background for labelling purposes, and acting as a mounting point for display elements and switches. On the circuit cards may be seen card ejectors 108 which serve to mechanically assist in both seating the connectors, securing the circuit card in place, and removing the circuit card. The faceplates 107 of the circuit cards 106 form a substantially planar front to the shelf when the cards are secured in place.

Across the top of the shelf is sited a cable trough 110 for the routing of cables 112. In this embodiment the cable trough is disposed at the top of the shelf. An alternate arrangement would be to have the cable trough disposed at the bottom of the shelf. As is readily apparent, the cable trough provides a measure of protection for the cables traversing the length of the shelf, allowing the cables to be disposed behind the plane of the front of the shelf. Under some arrangements the cable tray is provided with a detachable access cover (not shown) secured to the shelf 102. The access cover provides further security for the cables, both keeping the cables within the cable routing trough and preventing access thereto.

Referring now to the circuit card 120, there may be seen a faceplate assembly according to an embodiment of the invention. The faceplate assembly has an elongated housing 122 having a vertical first 124 and second 126 side surface spaced apart and disposed in parallel to each other, thereby defining a pair of side edges. A vertical rear surface 128 is disposed substantially 90° to the first 124 and second 126 side surfaces. This rear surface 128 and first 124 and second 126 side surfaces define a cabling volume 130, located immediately in front of rear surface 128 and behind the foremost edges of first 124 and second 126 side surfaces, into which cables may be deployed.

At one end of the cabling volume 130 is an aperture 132 in open communication with the cable trough 110. In FIG. 1 the aperture 132 is located at the upper end of the cabling volume 130 as the cable trough in this embodiment is above the shelf. In alternative arrangements where the cable trough is disposed below the shelf, the aperture 132 would be located at the lower end of the cabling volume 130. The aperture 132 may be formed by the extreme edges (top or bottom as the case may be) of the rear surface 128 and first 124 and second 126 side surfaces. Alternatively the aperture 132 may be an opening in a top or bottom wall at the extreme end of the cabling volume.

Adjacent aperture 132 may be seen retention tabs 134. These retention tabs 134 are disposed on or adjacent the foremost edges of the first 124 and second 126 side surfaces and serve to contain the cables 114 within the cabling volume 130. The retention tabs 134 are shown as an opposed pair having a gap between which a bight of a cable may be placed. Alternative arrangements are contemplated, such as a plurality of tabs disposed along the foremost edges of the first 124 and second 126 side surfaces, and resilient tabs which could be overlapped for retention and resiliently displaced when cable removal or rearrangement is necessitated.

Disposed on rear surface 128 are a plurality of connectors 140, 142, and 144. These connectors may be optical connectors 142 for termination of optical fiber cables, or electrical connectors 140 and 144. Connector types may be varied and mixed as appropriate for the applications served by the electronic equipment. For example, "DB" series connectors may be used for routing digital signals, "RJ" series connectors for telecommunication signals, and general purpose post connectors for general purpose connections.

Further contemplated is the use of connector type adapters. With an appropriate depth of cabling volume 130, a particular connector type disposed on rear surface 128 may be adapted to a different type by a plug-in adapter. The cabling volume 130 depth may be sized to accommodate the normal depth required by the cable and connector mating plus the additional depth imposed by a plug-in adapter. The results of such a sizing allow for alternation of cable types in the field i.e. after installation, enhancing the range of life of the installation.

Referring again to faceplate assembly 120, there may be seen an access panel 150, attached to one side of elongated housing 122 by hinges 152. Also visible is a locking means 154 which may be used to secure the access panel 150 against the elongated housing 122 in a closed position. The access panel 150 serves to retain cables 114 within the cabling volume 130. Further, access panel 150 provides a protective shielding feature in by precluding accidental ingress to the cabling volume 130. The access panel 150 also results in a more pleasing appearance, covering the cables 114 terminating on the plurality of connectors 140, 142 and 144 and presenting a uniform and tidy appearance to the shelf front. The access panel 150 may also be used to carry labelling information or as a mounting point for display type devices (not shown) such as lamps or alphanumeric displays. These display type devices are typically used to indicate operational status and warning or error conditions.

Locking means 154 enhances security of the access cover, both against accidental opening and providing a measure of protection against unauthorized intrusion. The locking means 154 may be tool operated latch or a lock designed to be secured with a key.

An alternative embodiment for faceplate assembly 120 would dispense with the hinges 152 and have a removable access panel 150. A removable access panel 150 could be secured with mechanical fasters or via a press or snap-fit arrangement. Locking means 154 could also be present in this embodiment, either for assisting in fastening removable access panel 150 in place, or to provide a measure of security were its operation to require a special tool or key.

Figure 2:
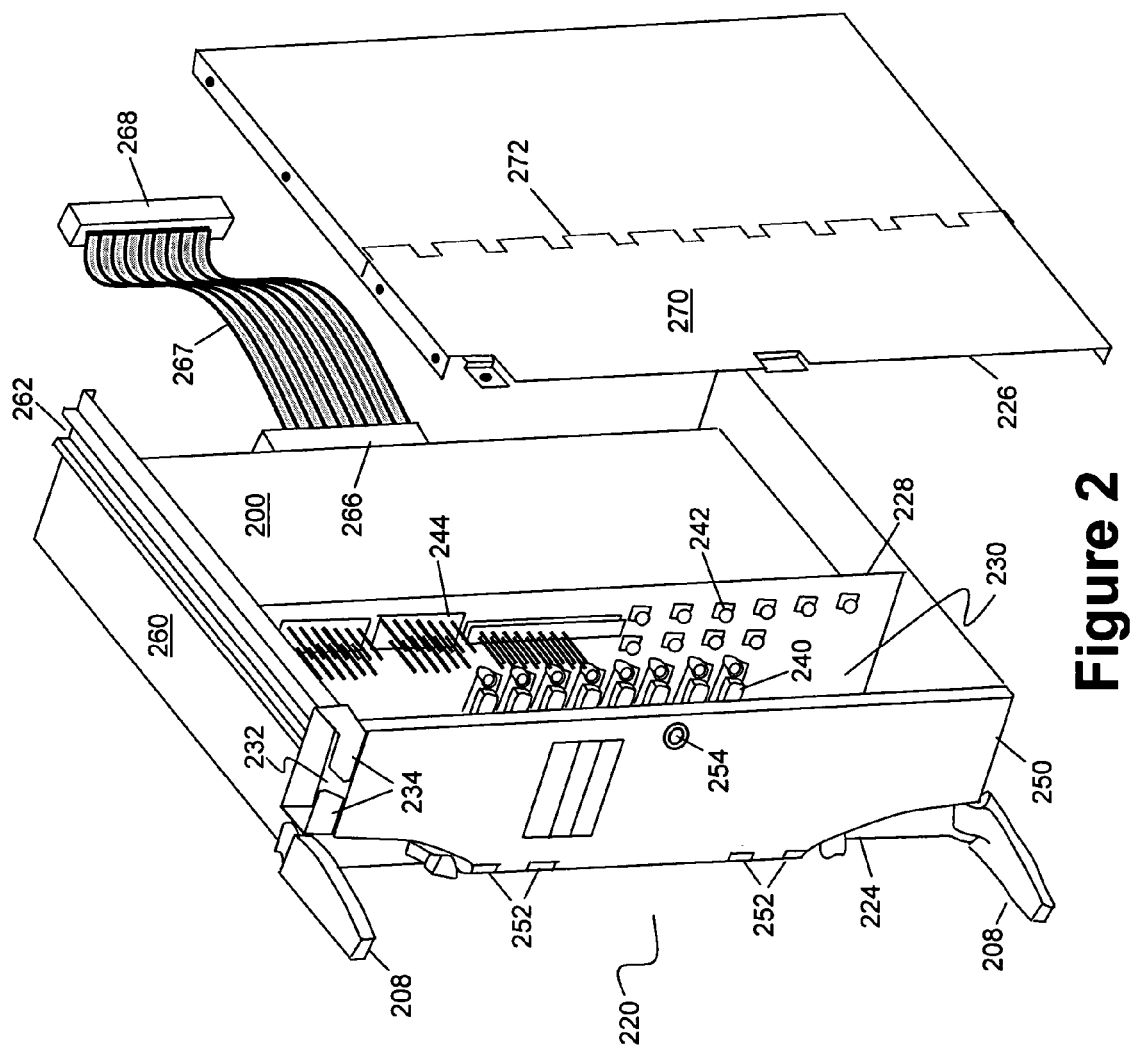
FIG. 2 is a perspective view of a printed circuit board assembly with a recessed connectorized faceplate according to an embodiment of the invention.

Referring now to FIG. 2 there may be seen a perspective view of a printed circuit board 200 with a faceplate assembly 220 according to an embodiment of the invention.

In FIG. 2 access panel 250 is shown in closed position. On access panel 250 there may be seen locking means 254 and display 256. As described earlier, display 256 may comprise lamps or alphanumeric type displays. Access panel 250 is connected via hinges 252 to first side surface 224. Card ejectors 208 may be seen at the top and bottom of first side surface 224. Second side surface 226 has been removed in FIG. 2 so that the cabling volume 230 and rear surface 228 are visible. As in the previous embodiment, first 224 and second 226 side surfaces and rear surface 228 define cabling volume 230. Disposed on rear surface 228 are a plurality of connectors 240, 242, and 244. Located at the top of cabling volume 230 is aperture 232 which allows ingress and egress of cables from the shelf cable trough (presumed to be located above the shelf for this embodiment) to the cabling volume 230. Adjacent the aperture 232 may be seen a pair of retention tabs 234 which serve to guide and retain the cables within the cabling volume 230. At the top edge of rear surface 228 may seen top surface 260 which has a guide rail 262 disposed thereupon. The guide rail 262 engages corresponding rails or lugs in the shelf and assists alignment of the card upon insertion and withdrawal from the shelf as is well known in the art. At the rear of circuit board 200 may be seen connector 266, bridging cable 267, and backplane connector 268 used to connect to the shelf backplane or midplane. In this embodiment of the invention, the combination of bridging cable 267 and connectors 266 and 268 allow partial withdrawal of the printed circuit board 200 and associated faceplate assembly 220 from the shelf while maintaining electrical connectivity to the backplane or midplane via bridging cable 267. The bridging cable 267 could be a ribbon cable which would allow ready flexing of the cabling as the card is inserted into the shelf. Alternatively, more standard bundled cable could be used between the connectors. In an alternative contemplated embodiment, connector 266 could be designed for direct connection to the backplane or midplane, eliminating bridging cable 267 and backplane connector 268.

Second side surface 226 has been equipped with a panel 270 which may be pivoted outward i.e. away from cabling volume 230 via hinge 272. Panel 270 may be pivoted outward to provide enhanced access to cabling volume 230. The operation of panel 270 may be effected to some extent when the circuit card in the adjacent card slot is not present, however it is anticipated that the operation of panel 270 will prove particularly useful when the circuit card so equipped is withdrawn somewhat from the shelf while connection to the backplane or midplane is maintained via connectors 266 and 268 and bridging cable 267. In this mode of use, access to cabling volume 230 and the connectors disposed on rear surface 228 is considerably enhanced as one side wall bounding cabling volume 230 is effectively moved out of the way. It is anticipated that this mode of operation may prove particularly efficacious when the shelf is in operation. Note that panel 270 facilitates access to cables within cabling volume 230 and connectors disposed on rear surface 228, but access is not precluded by panel 270 situated in the closed position.

Figure 3:
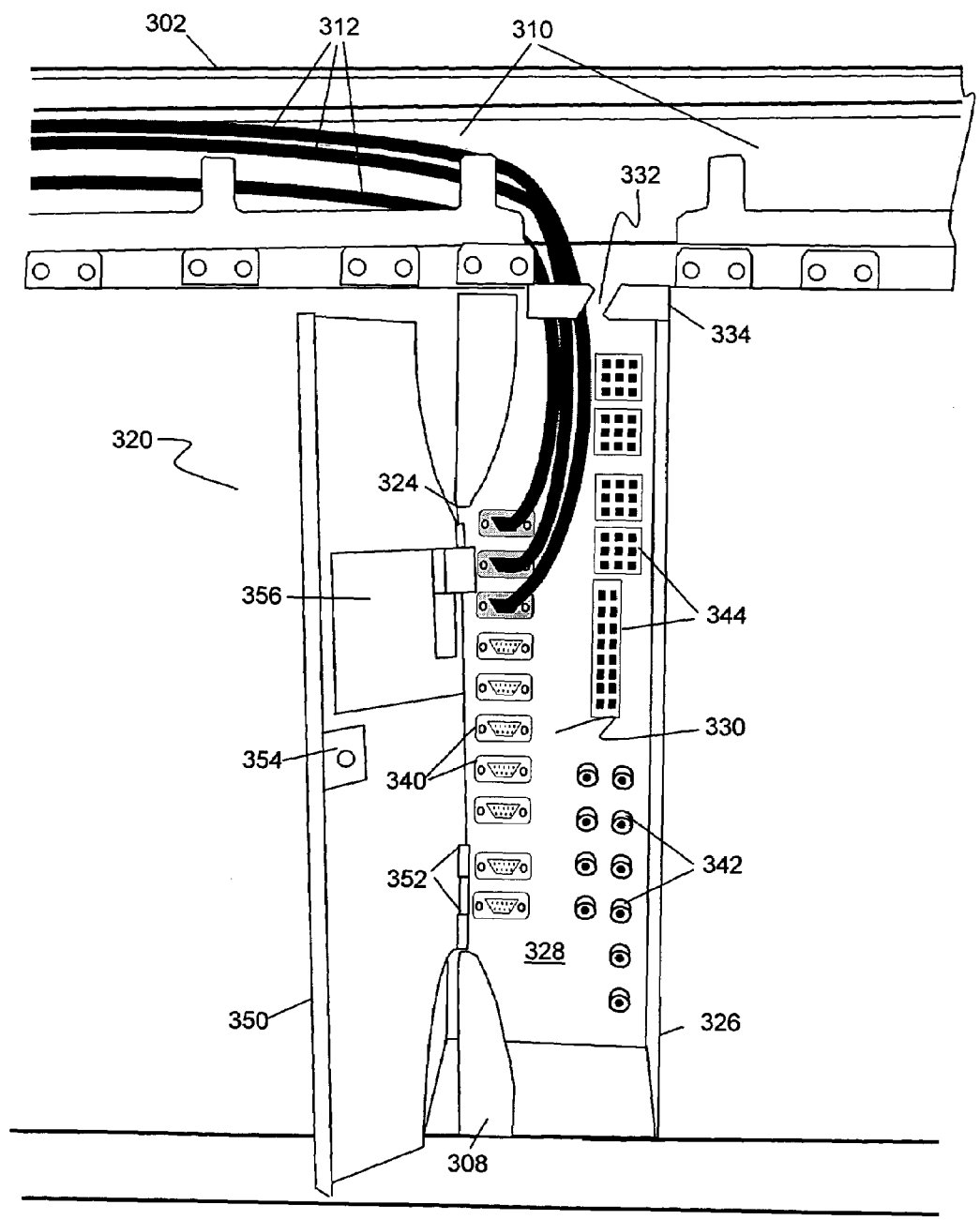
FIG. 3 is a perspective view of a printed circuit board assembly with a recessed connectorized faceplate installed in a shelf according to an embodiment of the invention.

Referring now to FIG. 3 there may be seen a perspective view of a printed circuit board with a faceplate assembly 320 installed in a shelf 302 according to an embodiment of the invention.

In FIG. 3 access panel 350 is shown in the open position. On access panel 350 there may be seen the back of locking means 354 and likewise the back of display 356. Access panel 350 is connected via hinges 352 to first side surface 324. Card ejectors 308 may be seen at the top and bottom of faceplate assembly 320. As in the previous embodiment, first 324 and second 326 side surfaces and rear surface 328 define cabling volume 330. Disposed on rear surface 328 are a plurality of connectors 340, 342, and 344. Located at the top of cabling volume 330 is aperture 332 which allows ingress and egress of cables 312 from the shelf cable trough 310 (presumed to be located above the shelf for this embodiment) to the cabling volume 330. Adjacent the aperture 332 may be seen a pair of retention tabs 334 which serve to guide and retain the cables 312 within the cabling volume 330.

In operation, a circuit card equipped with a faceplate assembly 320 would be inserted into shelf 302 and latched into place via card ejectors 308. Access panel 350 would be pivoted open on hinges 352 after operation of locking means 354. Cables 312 would be routed from the wiring trough 310 through the aperture 332 into the cabling volume 330. The connectors on the ends of the cables would be connected to the appropriate connectors (in general 340, 342, and 344) located on rear surface 328. Once the connections were made, access panel 350 would be closed and secured via locking means 354. The faceplate assembly 320 would then present a uniform facade in alignment with the other faceplates of cards disposed in the shelf, both protecting and securing the cable connections.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A faceplate assembly for a circuit pack in an equipment shelf having a cable routing trough vertically adjacent said equipment shelf, the faceplate assembly comprising:
    an elongated housing having a vertical first and second side surface spaced apart and disposed in parallel to each other defining a pair of foremost side edges;
    a vertical rear surface disposed substantially 90° to said side surfaces whereby said rear surface and first and second side surfaces defining a cabling volume;
    an aperture adjacent said cable routing trough defined at a vertical end of said cabling volume in open communication between said cabling volume and the cable routing trough; and
    a plurality of connectors disposed on said rear surface for the termination of cables routed through the cable trough and said aperture.

2. The apparatus of claim 1 further comprising:
    a plurality of retention tabs adjacent said foremost side edges disposed adjacent to said aperture end of said cabling volume for retaining cables therewithin.

3. The apparatus of claim 1 further comprising:
    a detachable access cover securable to said elongated housing for providing a vertical front face to said cabling volume.

4. The apparatus of claim 3 wherein said access cover comprises a hinge.

5. The apparatus of claim 4 wherein said access cover comprises a locking means.

6. The apparatus of claim 3 wherein
    said access cover comprises a hinge and
    said aperture is at the top of said cabling volume.

7. The apparatus of claim 1 wherein said plurality of connectors comprise at least one of the group of optical connectors and electrical connectors.

8. The apparatus of claim 1 wherein said second side surface comprises a panel and a vertical hinge means whereby upon withdrawing said circuit pack from said equipment shelf said second side surface may be displaced away from said first side surface for facilitating access to said plurality of connectors disposed on said rear surface.

9. The apparatus of claim 1 further comprising:
    a bridging cable connected at a first end to said circuit pack; and
    a backplane connector connected at a second end of said bridging cable for connection to a backplane or a midplane of the equipment shelf.

10. A method for providing physical protection of a plurality of cable connection points on a faceplate for a circuit pack in an equipment shelf having a cable routing trough vertically adjacent said equipment shelf, the method comprising:
    providing a faceplate assembly comprising an elongated housing having a vertical first and second side surface spaced apart and disposed in parallel to each other defining a pair of foremost side edges; a vertical rear surface disposed approximately 90° to said side surfaces whereby said rear surface and first and second side surfaces defining a cabling volume; an aperture adjacent said cable routing trough in open communication between said cabling volume and the cable routing trough; and a plurality of connectors disposed on said rear surface;
    routing a cable from a distal connection point via the cable routing trough and through said aperture into said cabling volume; and
    terminating said cable on one of said plurality of connectors.

11. The method of claim 10 wherein said faceplate assembly further comprises:
    a plurality of retention tabs adjacent said foremost side edges disposed adjacent to said aperture end of said cabling volume for retaining cables therewithin.

12. The method of claim 10 wherein said faceplate assembly further comprises a detachable access cover securable to said elongated housing for providing a vertical front face to said cabling volume.

13. The method of claim 12 wherein said access cover comprises a hinge.

14. The method of claim 13 wherein said access cover comprises a locking means.

15. The method of claim 10 wherein said plurality of connectors comprise at least one of the group of optical connectors and electrical connectors.

16. The method of claim 10 wherein said second side surface comprises a panel and a vertical hinge means whereby upon withdrawing said circuit pack from said equipment shelf said second side surface may be displaced for facilitating access to said plurality of connectors disposed on said rear surface.

17. The method of claim 10 wherein said circuit pack further comprises
    a bridging cable connected at a first end to said circuit pack; and
    a backplane connector connected at a second end of said bridging cable for connection to a backplane or a midplane of the equipment shelf.

18. A faceplate assembly for a circuit pack in an equipment shelf having a cable routing trough vertically adjacent said equipment shelf, the faceplate assembly comprising:
    an elongated housing having a vertical first and second side surface spaced apart and disposed in parallel to each other defining a pair of foremost side edges;

a vertical rear surface disposed substantially 90° to said side surfaces whereby said rear surface and first and second side surfaces define a cabling volume;

an aperture defined at a vertical end of said cabling volume in open communication between said cabling volume and the cable routing trough; and a plurality of connectors disposed on said rear surface for the termination of cables routed through the cable trough and said aperture, wherein said second side surface comprises a panel and a vertical hinge means whereby upon withdrawing said circuit pack from said equipment shelf said second side surface may be displaced away from said first side surface for facilitating access to said plurality of connectors disposed on said rear surface.

19. A faceplate assembly for a circuit pack in an equipment shelf having a cable routing trough vertically adjacent said equipment shelf, the faceplate assembly comprising:

an elongated housing having a vertical first and second side surface spaced apart and disposed in parallel to each other defining a pair of foremost side edges;

a vertical rear surface disposed substantially 90° to said side surfaces whereby said rear surface and first and second side surfaces define a cabling volume;

an aperture defined at a vertical end of said cabling volume in open communication between said cabling volume and the cable routing trough;

a plurality of connectors disposed on said rear surface for the termination of cables routed through the cable trough and said aperture;

a bridging cable connected at a first end to said circuit pack; and a backplane connector connected at a second end of said bridging cable for connection to a backplane or a midplane of the equipment shelf.

20. A method for providing physical protection of a plurality of cable connection points on a faceplate for a circuit pack in an equipment shelf having a cable routing trough vertically adjacent said equipment shelf, the method comprising:

providing a faceplate assembly comprising an elongated housing having a vertical first and second side surface spaced apart and disposed in parallel to each other defining a pair of foremost side edges; a vertical rear surface disposed approximately 90° to said side surfaces whereby said rear surface and first and second side surfaces define a cabling volume; an aperture in open communication between said cabling volume and the cable routing trough; and a plurality of connectors disposed on said rear surface;

routing a cable from a distal connection point via the cable routing trough and through said aperture into said cabling volume; and terminating said cable on one of said plurality of connectors, wherein said second side surface comprises a panel and a vertical hinge means whereby upon withdrawing said circuit pack from said equipment shelf said second side surface may be displaced for facilitating access to said plurality of connectors disposed on said rear surface.

21. A method for providing physical protection of a plurality of cable connection points on a faceplate for a circuit pack in an equipment shelf having a cable routing trough vertically adjacent said equipment shelf, the method comprising:

providing a faceplate assembly comprising an elongated housing having a vertical first and second side surface spaced apart and disposed in parallel to each other defining a pair of foremost side edges; a vertical rear surface disposed approximately 90° to said side surfaces whereby said rear surface and first and second side surfaces define a cabling volume; an aperture in open communication between said cabling volume and the cable routing trough; and a plurality of connectors disposed on said rear surface;

routing a cable from a distal connection point via the cable routing trough and through said aperture into said cabling volume; and terminating said cable on one of said plurality of connectors;

wherein said circuit pack further comprises a bridging cable connected at a first end to said circuit pack; and a backplane connector connected at a second end of said bridging cable for connection to a backplane or a midplane of the equipment shelf.

* * * * *